(12) United States Patent
Hurrell et al.

(10) Patent No.: US 9,525,409 B2
(45) Date of Patent: Dec. 20, 2016

(54) SIGNAL GATE, A SAMPLING NETWORK AND AN ANALOG TO DIGITAL CONVERTER COMPRISING SUCH A SAMPLING NETWORK

(71) Applicant: Analog Devices Global, Hamilton (BM)

(72) Inventors: Christopher Peter Hurrell, Cookham (GB); Alan Bannon, Frankfield (IE); Michael Coln, Lexington, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/708,003

(22) Filed: May 8, 2015

(65) Prior Publication Data
US 2016/0329888 A1    Nov. 10, 2016

(51) Int. Cl.
*H03M 1/34*    (2006.01)
*H03K 17/16*   (2006.01)
*H03M 1/00*    (2006.01)
*H03M 1/12*    (2006.01)

(52) U.S. Cl.
CPC ............... *H03K 17/16* (2013.01); *H03M 1/00* (2013.01); *H03M 1/12* (2013.01)

(58) Field of Classification Search
CPC .................................. H03M 1/00; H03M 1/12
USPC ................. 341/163, 162, 120, 118, 122, 155
See application file for complete search history.

(56) References Cited

U.S. PATENT DOCUMENTS 5,831,562 A * 11/1998 Van Auken .......... G11C 27/024
                                                     327/94
2003/0161487 A1 * 8/2003 Husted ................ H04B 1/1027
                                                     381/94.5

\* cited by examiner

*Primary Examiner* — Joseph Lauture
(74) *Attorney, Agent, or Firm* — Schwegman Lundberg & Woessner, P.A.

(57) ABSTRACT

A signal gate is provided where the gate can be low impedance to allow a signal to pass or be high impedance to block it. The signal gate has two output nodes arranged such that during the blocking mode spurious signals passing through the gate by way of parasitic components are presented as common mode signals at the output nodes.

26 Claims, 16 Drawing Sheets

SIGNAL GATE, A SAMPLING NETWORK AND AN ANALOG TO DIGITAL CONVERTER COMPRISING SUCH A SAMPLING NETWORK

FIELD OF THIS DISCLOSURE

The present disclosure relates to improvements in signal gates and sampling networks, and to analog to digital converters including such sampling networks.

BACKGROUND

There are many applications where it is desirable to sample the amplitude of a signal at a known point in time and then to perform subsequent processing on that sampled value. Such sampling is frequently performed by connecting a capacitor to an input node which is often a voltage driven node such that the capacitor can be charged to the voltage of the voltage driven node. A switch is generally provided in series with the capacitor so as to break the circuit at a given moment in time thereby trapping charge on the capacitor and consequently holding the voltage that was across that capacitor fixed. In this "hold" state where the switch has been opened it is highly desirable that voltage changes at the input node do not cause perturbations in the voltage that has been held on the capacitor. However, in practice, the switch may be implemented using mechanical or semiconductor components which are imperfect. Imperfections, such as parasitic capacitance, allow fluctuations at the input node to perturb the voltage held on the capacitor. This in turn can cause subsequent processes such as analog to digital conversions to become perturbed and possibly to arrive at incorrect results.

SUMMARY

A signal gate is provided comprising a first input node and first and second output nodes. The signal gate is arranged such that during a first mode a low impedance path exists between the first input node and the first output node, and during a second mode voltage changes at the first input node give rise to common mode signals at the first and second output nodes.

Preferably an impedance of a path from the first input node to the second output node remains in a relatively high impedance state in both the first and second modes.

Preferably one or more sampling capacitors are connected to at least the first output node so as to form a sampling apparatus.

Preferably during the second mode the impedance between the first input node and the first output node is increased and may nominally be equivalent to breaking the path between the first input node and the first output node. The sampling apparatus may be provided in association with an analog to digital converter wherein the analog to digital converter includes a comparator and may also include a residue amplifier. The comparator may have first and second inputs. The analog to digital converter may include a sampling capacitor or sampling capacitors arranged to acquire an input voltage during an "acquire" phase and subsequently to hold the charge (or the voltage) during a "convert" phase of operation. The one or more sampling capacitors with their associated switches can be referred to as a sampling network. The sampling apparatus may be arranged, such that during the acquisition phase a voltage at an input node is transferred to the at least one sampling capacitor, and during the convert phase the sampled voltage or a voltage dependent on the sampled voltage is supplied to a first input of the comparator. Circuits in accordance with this disclosure arrange that during the conversion phase of operation any unwanted perturbations in the sampling network, resulting from subsequent voltage changes at the input node are conveyed along first and second substantially matched signal paths such that changes are presented as common mode signals, rather than differential signals, to the first and second inputs of the comparator (or residue amplifier) and are therefore largely rejected.

In an embodiment of this disclosure there is provided an analog to digital converter comprising:
  a first input node;
  at least a first sampling capacitor; and
  at least one input switch for connecting an associated one of at least a first sampling capacitor to the first input node during acquisition of an analog signal. A further signal path exists from the first input to a second node, the signal path having an impendence or a transfer characteristic (such as bandwidth) that substantially matches that of the at least one input switch in a high impendence state.

The at least one input switch may be part of a signal gate arranged to disconnect the at least a first sampling capacitor from the first input node during a convert phase. The analog to digital converter further includes a comparator having first and second inputs. A voltage on the at least a first sampling capacitor is provided to a first input of the comparator. The analog to digital converter further comprises a high pass filter operatively coupled to the first input node and the second input of the comparator.

The at least one sampling capacitor may be permanently or selectively connected to a first input of a comparator. A second input node of the comparator may be connected to a DC bias voltage or in the case of a differential converter, the second input node may be driven with a DC bias voltage or the complementary voltage to that of the first input node.

The sampling apparatus may be provided with a second input node and include components arranged such that during the second mode, such as a hold mode, involving the second input node voltage changes at the second input node give rise to common mode signals at the first and second output nodes.

The sampling apparatus may have further input nodes, and preferably each one of the further input nodes is associated with circuit components arranged such that voltage changes occurring at a further input node while that further input node is not operating in an acquire mode (i.e. not in the first mode) are attenuated and presented as common mode signals (i.e. signals of substantially equal amplitude, sign, and temporal alignment) at the first and second output nodes. The sampling arrangement may have further output nodes which can receive signals from one or more of the input nodes. These further output nodes are also arranged such that signals that leak through from input nodes that are not in an acquire mode or state (i.e. the input nodes are disconnected from the output nodes by opening "opening" switches) are presented to the output nodes as common mode signals.

The "switches" may be transistors which are operable to work in relatively low impedance states and relatively high impedance states. The transistor switches may be field effect transistors. Advantageously the transistors may be provided in pairs to form transmission gates. In such an arrangement an N-type transistor is provided in parallel with a P-type transistor such that the impedance of the transmission gate when it is in a low impedance state has a reduced dependence on the voltage at either side of the transmission gate. Other switching technologies are known to the person skilled in the art and may be used in conjunction with the present disclosure.

The teachings of the present disclosure may also be used with mechanical switches, such as relays or MEMS switches. This can allow for improved resilience to spurious signals in high voltage applications. Such spurious signals may result from connection or disconnection of loads which may be especially troublesome if the load has an inductive component. Spurious signals may also originate from lightning strikes on power lines.

In a further teaching in accordance with this disclosure there is provided a signal gate having an input node, an output node and a switch operable to provide a relatively low impedance between the input node and output node when in a first mode, and to provide a relatively high impedance between the input node and output node in a second mode. The signal gate further comprises a compensation path comprising an inverting amplifier having an input coupled to the input node and an output of the inverting amplifier coupled to the output node by way of a DC blocking component.

In accordance with a further teaching of this disclosure there is provided a multiplexer comprising at least one signal gate.

BRIEF DESCRIPTION OF THE DRAWINGS

Embodiments of this disclosure will now be described by way of non-limiting example with reference to the accompanying drawings in which.

DESCRIPTION OF SOME EMBODIMENTS OF THIS DISCLOSURE

Figure 1:
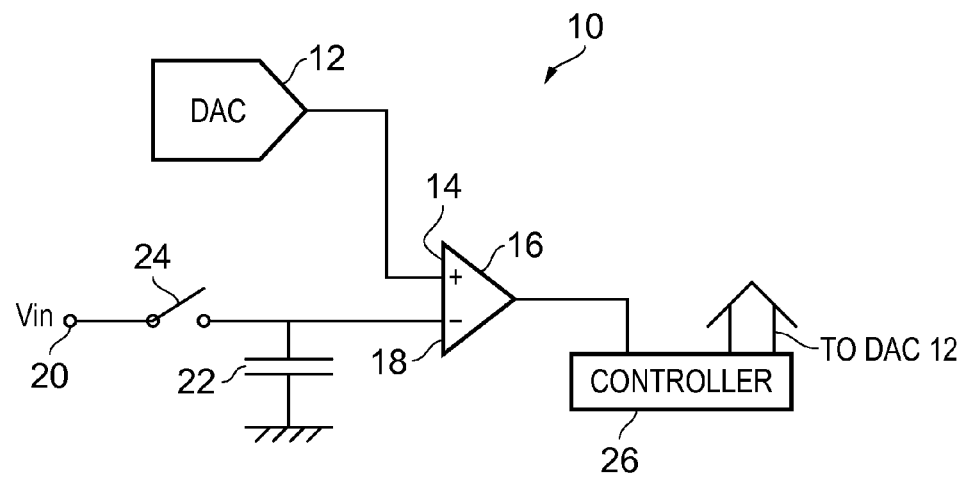
FIG. 1 is a circuit diagram of a first embodiment of an analog to digital converter including a sampling circuit.

FIG. 1 schematically represents a configuration of an analog to digital converter. The analog to digital converter, generally indicated 10, comprises a digital to analog converter 12 having an output connected to a first input 14 of a comparator 16. A second input 18 of the comparator 16 is arranged to receive a sampled and held version of an input signal Vin that was made available at an input node 20. The input signal Vin is supplied to a sampling capacitor 22 by way of an electrically controllable switch 24. During an acquisition phase the switch 24 is made low impedance such that the value of Vin at the input node 20 is transferred to the sampling capacitor 22. This can be considered as being a first mode of operation. When it is desired to hold the voltage the switch 24 is opened (made high impedance) and the charge stored on the capacitor is then trapped, and consequently the voltage across the capacitor remains steady (assuming no leakage to or from the second input 18 of the comparator 16). This can be considered as being a second mode of operation. A controller 26 may then drive the digital to analog converter 12 to output a series of analog values which are compared with the sampled value of the input signal by the comparator 16. The controller 26 is responsive to the output of the comparator 16 in order to modify the voltage output by the DAC 12 until such time as the controller has made a digital approximation of the sampled input voltage. Techniques such as ramp conversion or successive approximation conversion may be implemented by the controller 26.

Figure 2:
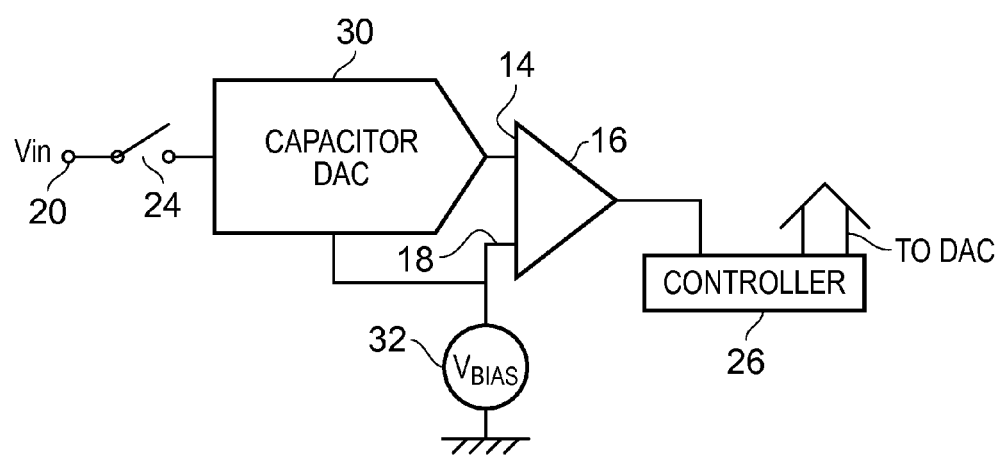
FIG. 2 is a circuit diagram of a capacitor array based analog to digital converter.

Commonly the sampling capacitor 22 and the DAC 12 can be implemented by a switched capacitor array 30, as would be described in more detail later, in order to reduce the size and component count of the analog to digital converter. Such an analog to digital converter is illustrated in FIG. 2. For a single ended converter, as shown in FIG. 2, the capacitor array 30 acts as both the sampling capacitor 22 and the digital to analog converter 12, and provides its output to a first input 14 of the comparator 16. Thus the second mode can encompass both a hold mode and a convert mode. A bias voltage Vbias generated by a bias voltage generator 32 is supplied to the second input 18 of the comparator 16 and may also be provided to the DAC 30. In a dual ended (differential) analog to digital converter a second capacitor DAC in association with its own input switch and input node may replace the bias voltage generator 32 and is connected to the second input of the comparator 16. These capacitor array based ADC technologies are known to the person skilled in the art.

Figure 3:
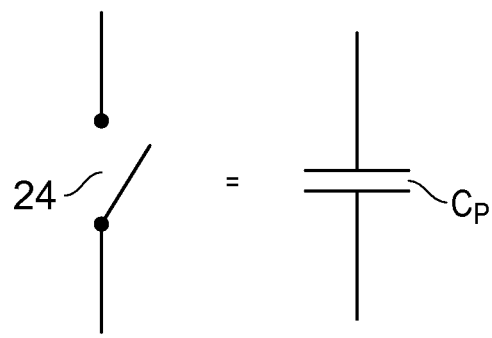
FIG. 3 shows the equivalent circuit for parasitic components of a switch in the open configuration.

Ideally the switch 24, i.e. a signal gate, of FIGS. 1 and 2 should rapidly transition between a low impedance state, ideally 0 ohms, and a high impedance state, ideally an infinite impedance, in response to a control signal for the switch provided by the controller 26. However, in practice the transistors or other components used to form the or each switch 24 are not ideal. FIG. 3 schematically illustrates the input switch 24 in its open (high impedance) state and its major equivalent component, which is a parasitic capacitance CP. To a lesser extent there will also be large value resistance in parallel with the parasitic capacitance, but for the purposes of the teachings of this disclosure that is a second order effect which we can ignore.

Figure 4:
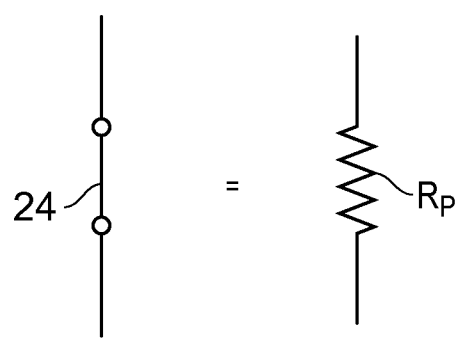
FIG. 4 shows the equivalent circuit for a switch in the closed configuration.

FIG. 4 schematically shows the equivalent circuit for the switch 24 when it is closed (low impedance), whereby the transistor switch 24 is represented by a parasitic resistance RP, which for a FET corresponds to the RDS-On value of the transistor. The existence of these parasitic components can give rise to potentially incorrect bit trial decisions in the analog to digital converter 10 at so called "critical decisions" where the sampled input voltage and the digital to analog converter 30 output voltage are very close to one another. In these circumstances voltage changes occurring at the input node 20 have the potential to propagate through the parasitic capacitor of the switch 24 and thereby to temporarily modify the voltage occurring at one of the comparator inputs. This in turn can cause the comparator 16 to make an incorrect decision, such as discarding a bit where the bit within the bit trial should have been kept, or keeping a bit where the bit within the bit trial should have been discarded.

Figure 5:
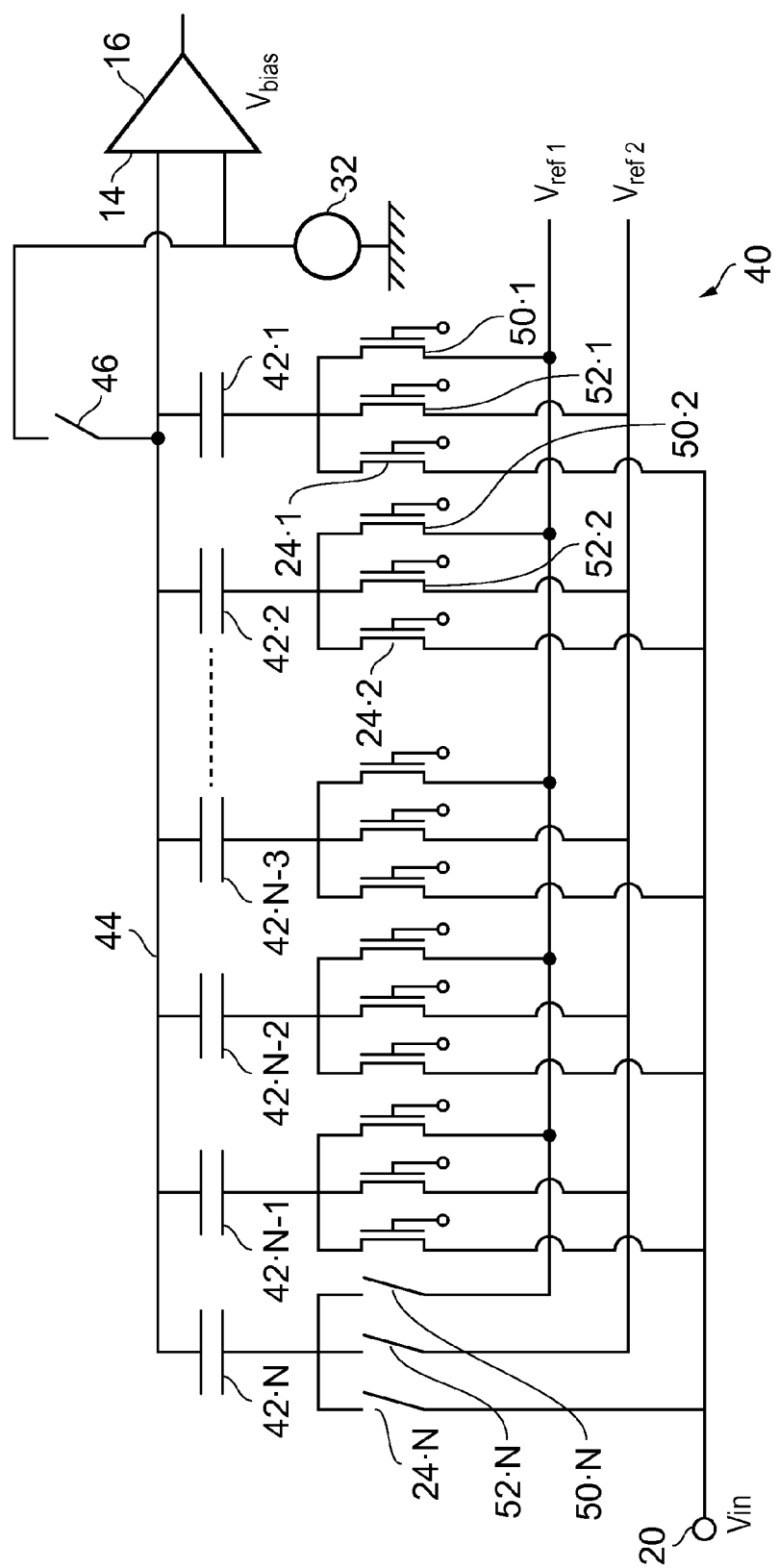
FIG. 5 schematically illustrates a configuration of a capacitor array based analog to digital converter of FIG. 2 in greater detail.

FIG. 5 schematically illustrates an embodiment of the capacitor array 30 of FIG. 2 in greater detail in order that teachings of this disclosure can be applied as an example in the context of an analog-to-digital converter which is often implemented within integrated circuit technologies. The analog-to-digital converter, generally designated 40, comprises a variety of capacitors 42.1 to 42.N. Often, though not necessarily, the capacitors are binary weighted with a capacitor 42.1 having a smallest value, which can be a unit capacitance of arbitrary value 1 C. Consequently capacitor 42.2 has a value of 2 C, capacitor 42.3 would have a value of 4 C, and so on all the way up to capacitor 42.N having a value of $2^N$C. Segmentation, as known to the person skilled in the art, may be used to achieve the desired weighting between the various capacitors without requiring a physical variation in actual capacitance of $2^N$. Each of the capacitors 42.1 to 42.N has a first plate (also known as a top plate) which in this example is connected to a common conductor 44 which is connected to the first input 14 of the comparator 16. The first plates of the capacitors 42.1 to 42.N can optionally be connected to a bias voltage, such as ground or a mid-point between the supply rail voltages generated by a bias voltage source 32, by way of a sampling switch 46.

The second plates of the capacitors 42.1 to 42.N are connectable by way of respective transistor switches to at least a first reference voltage Vref1, and a second reference voltage Vref2. Some, or as shown in FIG. 5, all of the capacitors 42.1 to 42.N may also be connected by way of respective switches to the input node 20. For convenience each of the individual capacitors and their respective switches can be regarded as forming a cell within the capacitor array of the analog-to-digital converter 40. Considering the switches associated with the most significant cell, i.e. that which includes the capacitor 42.N, then we can define one of these switches 24.N as selectively opening and closing a path between the input node 20 and the second plate of the capacitor 42.N. A further switch 50.N is provided to controllably connect the bottom plate of the capacitor 42.N to the first reference voltage Vref1, and similarly a second switch 52.N is provided to controllably connect the second plate of the capacitor 42.N to the second reference voltage Vref2. The switches 24, 50 and 52 may conveniently be provided by n-type MOSFET transistors, as explicitly drawn for the first cell associated with capacitor 42.1 up to the N−1th cell associated with the capacitor 42.N−1.

Each of the switches 50.1 to 50.N, 52.1 to 52.N, and 24.1 to 24.N are responsive to switch control signals from the controller 26 (FIG. 2). The operation of a successive approximation routine, SAR, analog-to-digital converter is well known. However, by way of a reminder, during an acquire phase, the switches 50.1 to 50.N and 52.1 to 52.N are made high impedance, whereas the switches 24.1 to 24.N and switch 46 are closed, i.e. low impedance, such that the voltage Vin at the input node 20 is presented to each of the capacitors 42.1 to 42.N and charges them to Vin-Vbias. When the controller wishes to transition from a sample or track regime to a hold regime the switch 46 is made high impedance. This effectively traps the charge on each of the capacitors 42.1 to 42.N. The switches 24.1 to 24.N are then opened (high impedance) completing the end of the acquire phase. The controller 26 then moves the analog-to-digital converter 40 into a convert phase where successive bit trials are performed starting with the most significant bit, as represented by capacitor 42.N, and moving to the least significant bit, as represented by capacitor 42.1. For the first bit trial switch 50.N is closed, whereas the switches 50.N−1 to 50.1 are open. Similarly switch 52.N is open whereas the switches 52.N−1 to 52.1 are closed. This causes the reference voltage Vref1 to be capacitively divided between the capacitors, subject to an offset resulting from the sampled input voltage Vin, and presented to the comparator 16 which then compares the voltage at its first node 14 with the voltage provided by the bias generator 32 to decide whether the switches associated with the first capacitor 42.N should be kept in their present configuration or reset. Once this decision has been made, then the next most significant capacitor 42.N−1 becomes the subject of the bit trial, with its second plate being connected to Vref1 while the remainder of the less significant capacitors 42.N−3 to 42.1 have their second plates connected to Vref2. Again the comparator 16 makes a decision whether the switches associated with the 42.N−1$^{th}$ capacitor should be kept in their present state or reset. The process continues until the last capacitor 42.1 has been tested. The controller is then able to output a digital approximation of the sampled analog input value.

Figure 6:
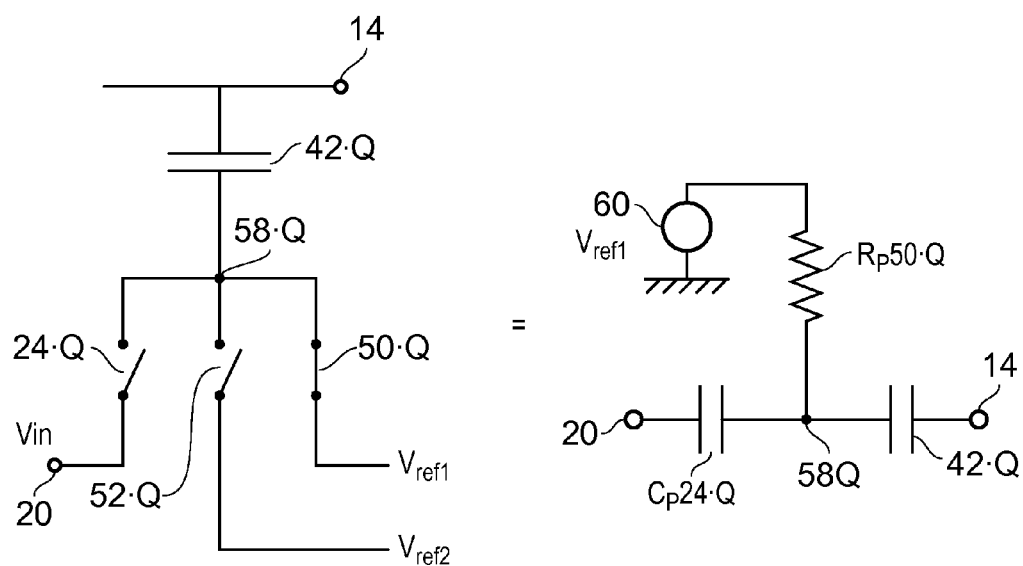
FIG. 6 illustrates an equivalent circuit for one cell of the capacitor array when in a first bit trial configuration.

FIG. 6 schematically illustrates the equivalent circuit for a single one of the cells of the analog-to-digital converter 40 when that cell is connected to Vref1. Suppose, for example, that we are considering a Qth cell of the N cells within the capacitor array. In this example Vref1 can be considered to be a non-zero voltage, whereas Vref2 is the local ground or zero volt line within the converter. When the Qth cell is connected to Vref1 the input node 20 is coupled to node 14 by way of the parasitic impedance $C_{P24Q}$ of the parasitic capacitance associated with the 24.Qth switch in series with the capacitor 42.Q. There is an impedance effectively to ground by way of the parasitic resistance $R_P$ of the 50.Qth switch shown in FIG. 6 as $R_{P50.Q}$ which from an AC point of view is connected to ground by virtue of the zero impedance associated with an ideal voltage reference generator 60 used to generate Vref1. The intermediate node 58Q between the switch 24Q and the capacitor 42Q represents a first output node of a signal gate that is associated with the capacitor 42Q.

Figure 7:
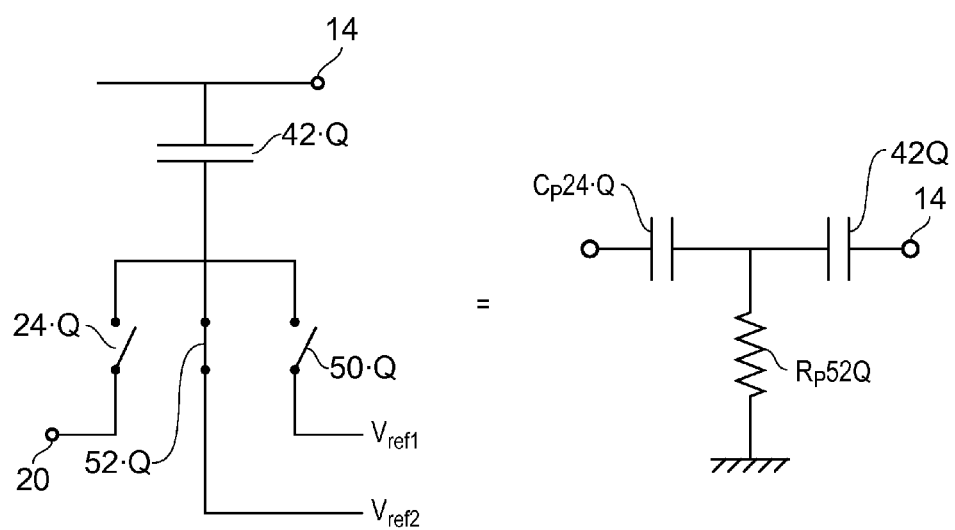
FIG. 7 schematically illustrates the equivalent circuit of a cell of the capacitor array when in a second bit trial configuration.

Similarly FIG. 7 shows the equivalent state of the Qth cell when connected to Vref2. Thus, for the Qth cell the input node 20 is coupled to the output node 14 by way of the parasitic capacitance associated with the 24.Qth switch designated here as $C_{P24.Q}$ in series with the capacitor 42Q. A path to ground exists through the transistor 52.Q, which is represented here by its parasitic resistance $R_{P52.Q}$.

FIGS. 6 and 7 serve to show that a high pass filter exists between the input node 20 and the second plate of the capacitor 42.Q in the Qth cell when the circuit is not in an acquire mode, i.e. not in the first mode of operation. The high pass filter is formed primarily by the parasitic capacitance across the input switch 24.Q together with the parasitic resistance of one or other of the transistors 50.Q and 52.Q. The signal that leaks through the switch 24.Q is coupled to the output node 14 by way of the capacitor 42.Q.

If the transistors 50.Q, 52.Q and 24.Q are scaled to the size of the Qth capacitor, then each one of the Qth cells should contribute in proportion to the value of the Qth capacitor to any perturbation at node 14 resulting from a change at node 20. However, if the transistors do not scale accurately compared to the size of the associated sampling capacitor then this assumption no longer holds true. It might also be assumed that transistors 50 and 52 within each of the Qth cells have the same parasitic capacitances and same on resistances. However this may not be the case as, for example, some of the transistors, such as transistors 52 connecting the capacitors to Vref2/ground might be formed as N-type devices, whereas the transistors 50 connecting respective capacitors 42 to Vref1 may need to be formed of P-type devices. Similarly the impedance of the voltage reference 60 may be significant compared to that of the transistors 50 and consequently the effective high pass filter characteristic of each cell might depend on whether that cell is representing a 0 or a 1 within the bit trial sequence of the analog-to-digital converter.

Figure 8:
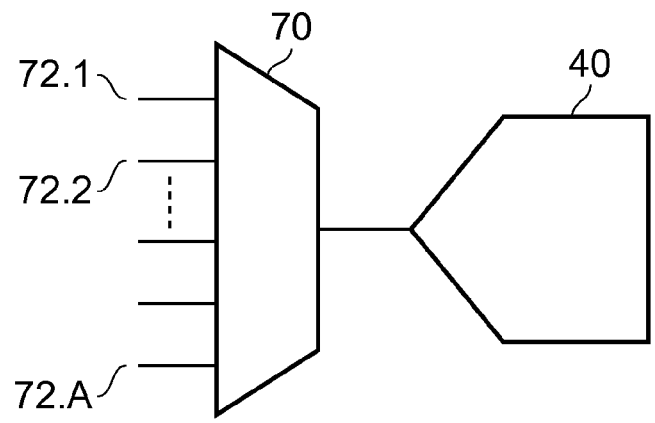
FIG. 8 schematically illustrates an arrangement where an analog to digital converter is associated with a multiplexer.

There are many reasons why the input voltage at node 20 of the ADC 40 might change suddenly. FIG. 8 represents a configuration where the ADC 40 receives its input from a multiplexer 70 which receives inputs 72.1 to 72.A and can select any one of those inputs for output to the analog-to-digital converter 40.

Figure 9:
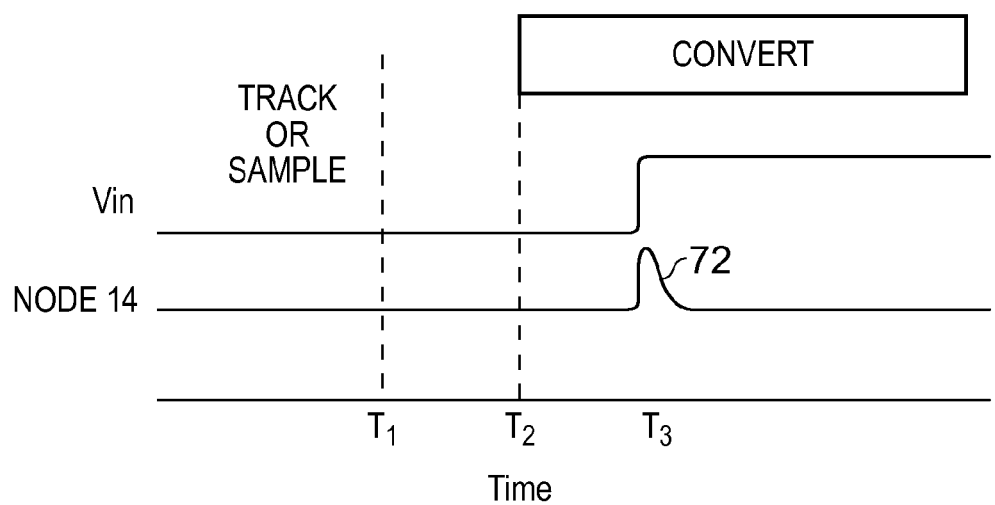
FIG. 9 illustrates the possibility of the voltage at the input node of the analog to digital converter changing during a convert process, and how that change might lead to a perturbation of the voltage within the analog to digital converter.

The operation of the multiplexer 70 in combination with the analog-to-digital converter 40 is shown in greater detail in FIG. 9. Here, assume that one of the A inputs 72.1 to 72.A, such as input 72.1 is selected by the multiplexer 70 for supply to the analog-to-digital converter 40. Initially the analog-to-digital converter 40 and its sampling circuit will be operating in an acquire mode where the output of the multiplexer 70 is provided to the capacitors 42 within the ADC 40. Thus the capacitors are effectively tracking or sampling the input voltage. However, at time $T_1$ the ADC 40 moves in to a hold mode where the sampling switch 46 is opened thereby "freezing" the input voltage Vin on each of the sampling capacitors 42.1 to 42.N. The switches 24.1 to 24.N are then opened and a settling time allowed such that at time $T_2$ the ADC 40 can commence its conversion sequence.

Now that the input signal has been sampled and held, the multiplexer 70 can be instructed to select a new channel for a subsequent conversion. Suppose that it selects the second input 72.2 and sends this to its output. Thus, from the ADC's point of view the input voltage Vin at its input node 20 may undergo a step change at time $T_3$ when the multiplexer selects a new channel. This step change in Vin can propagate through the parasitic filters formed by the open input switches in each of the cells within the ADC such that a perturbation, shown by decaying voltage spike 72 occurs at node 14, being the input to the comparator 16 (see FIG. 5). The voltage spike 72 is relatively short lived. However, if it occurs at the same time that the comparator is deciding the result of one of the bit trials performed within the ADC then this voltage spike could cause a bit trial error to occur where a bit is either incorrectly kept or incorrectly discarded.

The inventors realized that it would be very difficult in practice to stop this transient signal 72 propagating through the input circuitry. However its effect could be minimized if the transient perturbation 72 could be applied as a common mode error to both inputs of the comparator 16.

Figure 10:
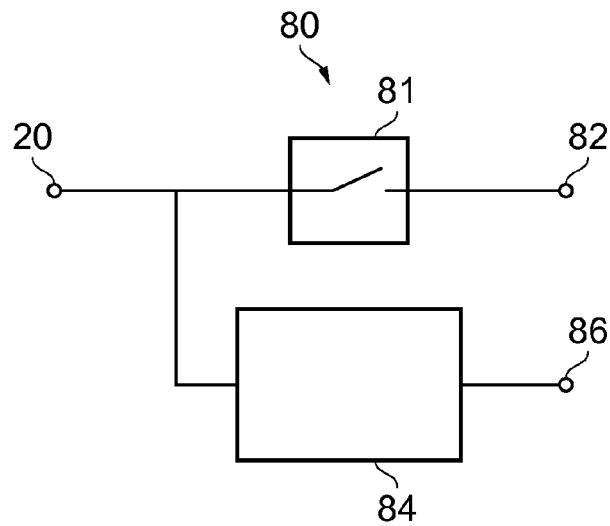
FIG. 10 illustrates a signal gate in accordance with the present disclosure.

FIG. 10 schematically illustrates a first embodiment of a signal gate in accordance with the teachings of this disclosure. The signal gate 80 comprises a switch 81, which typically is a transistor switch such as a field effect transistor. The switch is connected between an input node 20 and a first output node 82. The switch 81 is controlled in response to a control signal which may be supplied to the gate of the transistor in order to place it in a low impedance mode during the first mode of operation, and to make the transistor substantially non-conductive during the second mode of operation. However when the transistor is in its high impedance (non-conducting) state, a parasitic capacitance extends from the drain to the source of the field effect transistor and hence between the input node 20 and the first output node 82. This parasitic capacitance can allow transient signals to propagate from the input node 20 to the first output node 82. The signal gate 80 also includes a compensation component 84 connected between the input node 20 and a second output node 86. The compensation component 84 is typically a capacitor having a capacitance substantially equal to that of the transistor 81 in its non-conducting state.

Figure 11:
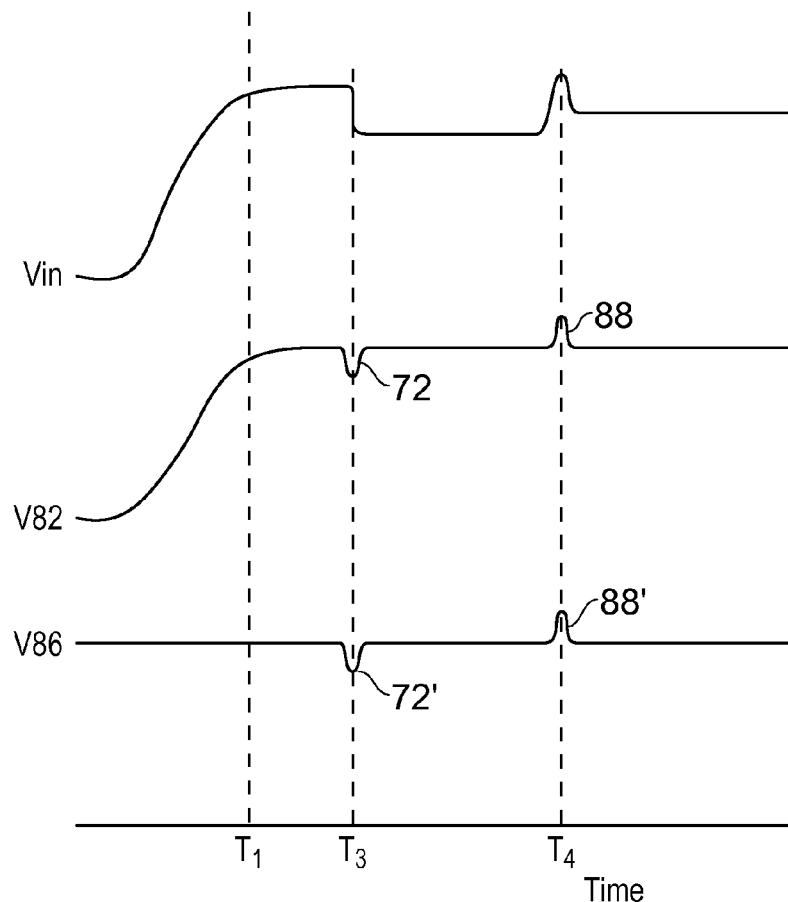
FIG. 11 illustrates how a perturbation can be presented as a common mode signal during the second mode of operation of the signal gate.

FIG. 11 schematically illustrates the operation of the signal gate 80 of FIG. 10. The input voltage Vin is shown in FIG. 11. Generally speaking the input voltage rises in a period of time prior to time T1. It is then substantially constant in the period between time T1 and T3, and then undergoes a step change at time T3 and a voltage spike at time T4. In FIG. 11 time T1 represents the transition of the signal gate 80 from operating in the first mode, to operating in a second mode. It should be assumed that the first output node 82 is connected to a sampling capacitor (not shown) such that the voltage at the first output node 82 should stay constant once the switch 80 has been made high impedance. Comparing FIG. 11 with FIG. 9, a step change to the voltage Vin occurs at time T3 in both FIGS. 9 and 11. This results in a transient voltage spike 72 occurring at node 82 by virtue of the parasitic capacitance of the switch 81. However it can also be seen that due to the capacitance of the compensation circuit 84, and equivalent voltage spike 72' occurs at node 86, represented by the line V86 in FIG. 11. Thus the step change in Vin is presented as a common mode signal at nodes 82 and 86. Similarly at time T4 Vin undergoes a short term signal change, which results in common mode transient signals 88 and 88' being presented at the first output node 82 and at the second output node 86 respectively. If these common mode signals are subsequently presented to a circuit, such as a comparator or a differential amplifier, then the signals should be substantially rejected.

Figure 12:
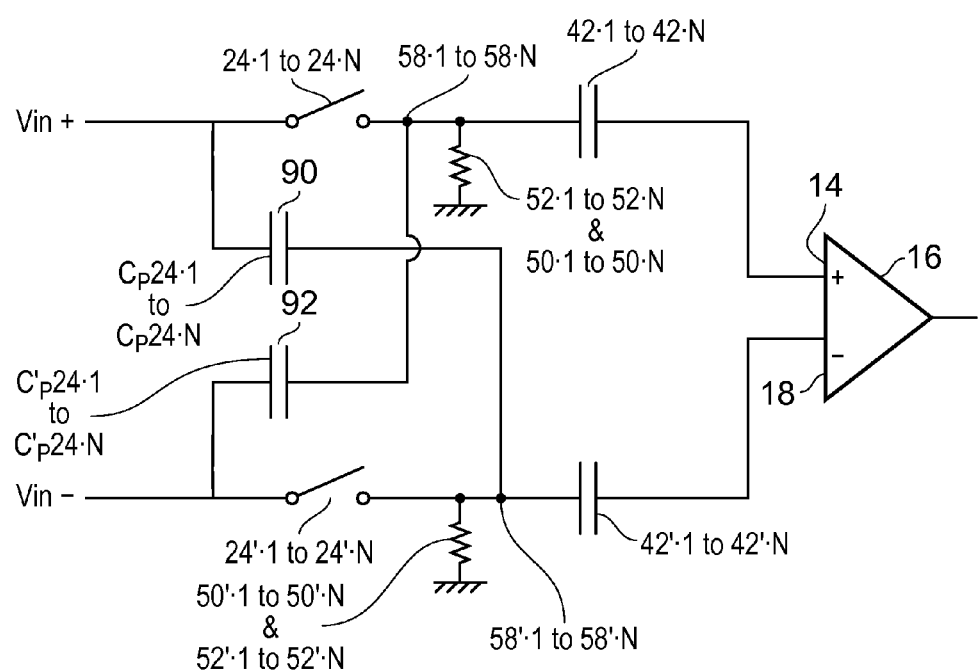
FIG. 12 illustrates a differential acquire and hold circuit, for example as implemented within the capacitor array analog to digital converter including a compensation arrangement according to the teachings of this disclosure.

FIG. 12 represents a differential sampling circuit including a signal gate where cross coupling paths 90 and 92, here in the form of capacitors, are provided such that any transient signals occurring on either of the input nodes Vin+ and Vin− of a dual ended signal gate occurs as a common mode signal at first output nodes 58.1 to 58.N and second output nodes 58'1 to 58'.N of the signal gate and hence as common mode signals at the comparator 16. The arrangement in FIG. 12 can be considered as being representative of a single one of the cells within a high side and low side capacitive array of a differential analog-to-digital converter. Equally however, it can be considered as an equivalent circuit for the entire converter, thus multiple versions of the cells have been coalesced into a single circuit. Each of the cells has a parasitic switch capacitance associated with its input switch 24.Q where 24.Q is one of the switches 24.1 to 24.N. An equivalent compensation component 90 or 92 having a capacitance equal to the open state of the switch parasitic capacitance $C_{P24}$, or summed as CP24.1 to CP24.N, is provided to cross couple a signal to the corresponding top plate of a capacitor in the other capacitor array of the differential converter.

The differential sampling circuit and analog to digital converter of FIG. 12 can be regarded as forming a non-inverting signal path connected to Vin+ and an inverting signal path connected to Vin−. When the sampling circuit in analog to digital converter of FIG. 12 moves out of its first mode of operation, i.e. from the acquire mode, to a hold mode and subsequently to a convert mode the switches 24.1 to 24.N in the non-inverting channel are made high impedance. Similarly the corresponding switches 24'.1 to 24'.N in the inverting channel are made high impedance. Considering just the non-inverting channel for simplicity, if a voltage change occurs at node Vin+ then that voltage change can propagate through the parasitic capacitance of the open switches 24.1 to 24.N. This signal is then attenuated by the filter formed between the parasitic capacitance of the input switches and the parasitic resistance of the transistors used to connect the capacitors to Vref1 or Vref2 as appropriate during the bit trials. Whilst this perturbation is small it is mitigated by providing the parasitic capacitors 90 which act to form an equivalent filter with the impedances of the transistor switches associated with the capacitors of the non-inverting signal path, and the signal is then attenuated by the capacitors 42'.1 to 42'.N in the capacitor array of the inverting signal path and presented to the second input 18 of the comparator 16. Thus perturbations of Vin+ are significantly attenuated and any resulting signal is provided as a common mode signal to the inverting 18 and non-inverting 14 inputs of the comparator 16. The capacitors 92 ensure that signal perturbations or changes at Vin− are similarly presented as common mode signals during the non-acquire mode of operation of the sampling circuit.

Figure 13:
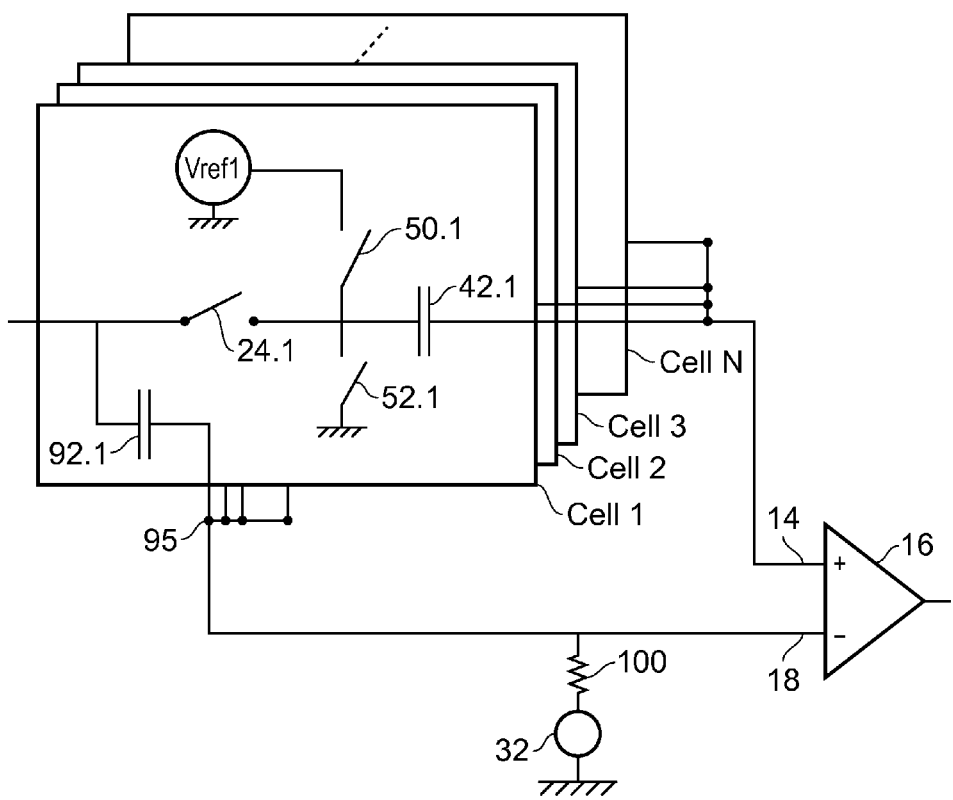
FIG. 13 is a circuit diagram of a single ended analog to digital converter including a compensation circuit in accordance with the teachings of this disclosure.

FIG. 13 shows an embodiment of a single ended converter. By way of contrast to FIG. 12, rather than drawing each of the switches 24.1 to 24.N as an equivalent single switch, the components have been drawn separately such that switch 24.1 is illustrated with switches 50.1 and 52.1 and capacitor 42.1 for a single cell, cell1, associated with bit 1, cells 2 and 3 are shown in stacked configuration for bit 2, bit 3 and so on up to bit N. For each cell a corresponding compensation capacitor is provided. Thus the first cell, cell1, associated with bit 1 has a compensation capacitor 92.1 fabricated to have a capacitance equivalent to that of switch 24.1 in its open state. Similarly cell 2 associated with bit 2 has a capacitor 92.2 having a capacitance equivalent to that of the switch 24.2 in its open state. Compensation capacitors 92.3 to 92.N are similarly provided for each of the cells associated with bit 3 to bit N. The outputs of the capacitors 92.1 to 92.N are connected together to a common mode 95 which may be connected to the bias voltage source 32 via a resistor 100 having a resistance selected to be approximately equal to the on resistance of the transistors 52.1 to 52.N in parallel. Thus the capacitors 92.1 to 92.N in combination with resistor 100 form a filter response equivalent to that of the composite response of the cells 1 to N associated with bits bit 1 to bit N.

Figure 14:
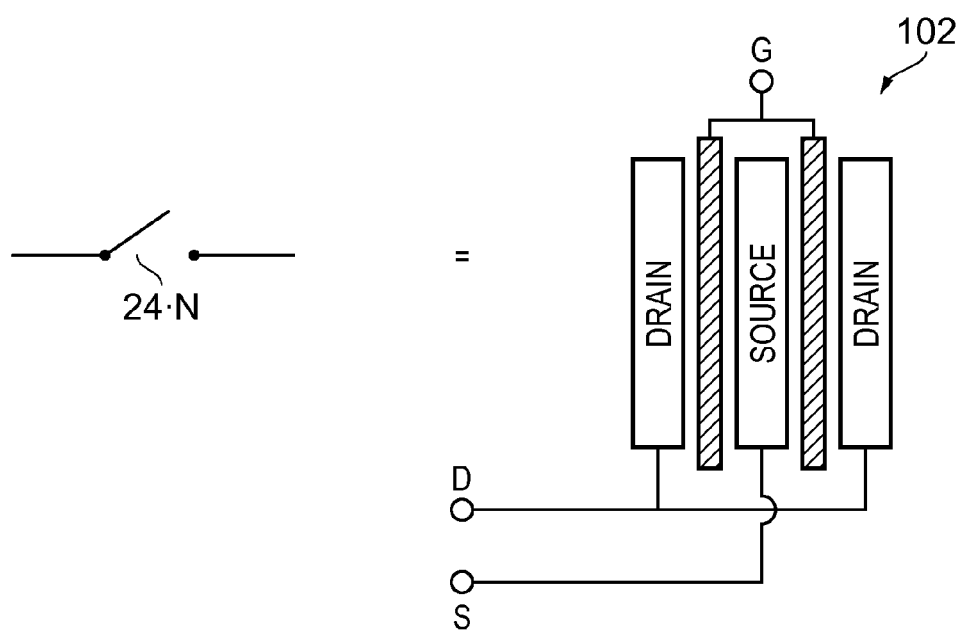
FIG. 14 illustrates a configuration of a permanently open switch configured to mirror the characteristics of a transistor switch in the signal path.

The compensation capacitors 92.1 to 92.N can be formed by fabricating a further transistor (or transistors) for each cell, where the further transistor(s) is identical to the signal gate transistor of that cell, i.e. to transistors 24.1, 24.2 and so on. Such an arrangement is shown in FIG. 14 for such an equivalent transistor generally designated 102 where the gate terminal may be tied to a voltage to hold the further transistor in a high impedance state. Alternatively, the drain, gate and source electrodes may be deposited, but the active regions of the further transistor may be omitted. Thus the drain and source regions may not be doped during fabrication. This gives a compensation capacitor which closely mirrors the source-drain parasitic capacitance of the input transistor (signal gate transistor) of the cell, assuming that the bulk of the coupling occurs between the metal connections of the transistor and allows the lay out pattern of the transistor to be reused to form the compensation capacitor. Thus scaling should be reliable. It may be desirable to form the compensation circuit as a capacitor in series with a transistor, where the transistor receives a control signal like the switch 24 so as to mimic any charge injection transient signals associated with changing the state of the associated input switch.

Figure 15:
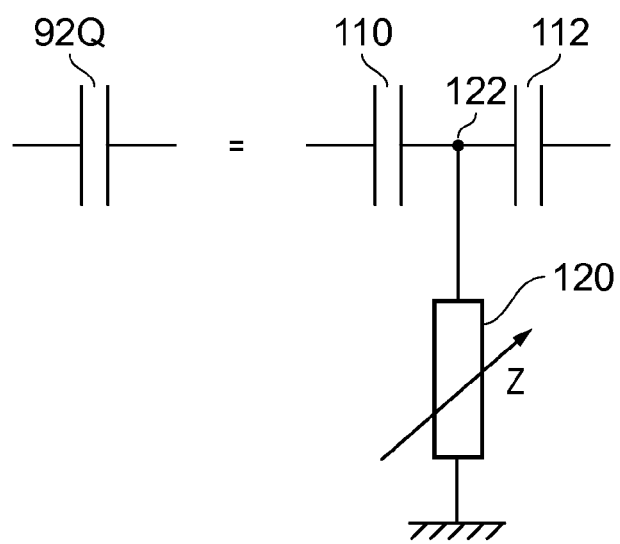
FIG. 15 is a circuit diagram of a trimmable impedance within the compensation path.
Figure 16A:
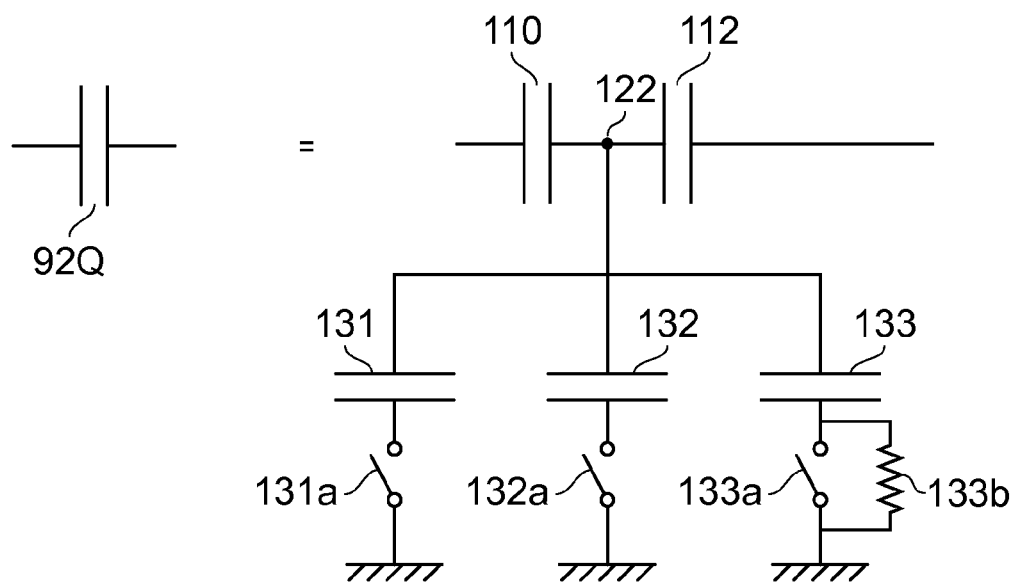
FIG. 16a is a circuit diagram representing an embodiment of a trimmable capacitance within the compensation path.

In some circumstances it may still be desirable to tune the impedance of the various compensation capacitors 92.1 to 92.N. As shown in FIG. 13, any of the input switches 24.1 to 24.N may be arbitrarily represented by a switch 24.Q. The switch 24.Q has a parasitic capacitance $C_{P24.Q}$. A compensation capacitor 92Q is provided to compensate for the parasitic capacitance of the switch 24Q. However it may be desired to trim the value of the compensation capacitor 92Q in order to account for parasitic effects due to conductive path layout within a circuit or even to trim dynamically on a bit trial by bit trial basis in order to account for the parasitic capacitances and/or parasitic resistances associated with each one of the cells making up the switched capacitor array. As shown in FIG. 15 the compensation capacitor 92Q may be provided as first and second series connected capacitors 110 and 112 with a variable impedance 120 connected to the node 122 between the capacitors 110 and 112. If it is desired to primarily vary the capacitance to match that of $C_{P24.Q}$ then, as shown in FIG. 16a, further capacitors 131, 132 and 133 may be connected to the node 122 of the compensation capacitor and each can be selectively connected to ground via respective transistor switches 131a to 133a. Such an arrangement can be provided for each and every one of the compensation capacitors within the circuit. The transistor switches may be provided in parallel with respective high value resistors just to stop the bottom plate of the capacitors floating when the switch is off. One resistor 133b is illustrated for diagrammatic simplicity. Alternatively additional switches, not shown, may be added that can connect the switched side of capacitors 131,132 or 133 to the input or output of the trim network so that they are not left floating.

Figure 16B:
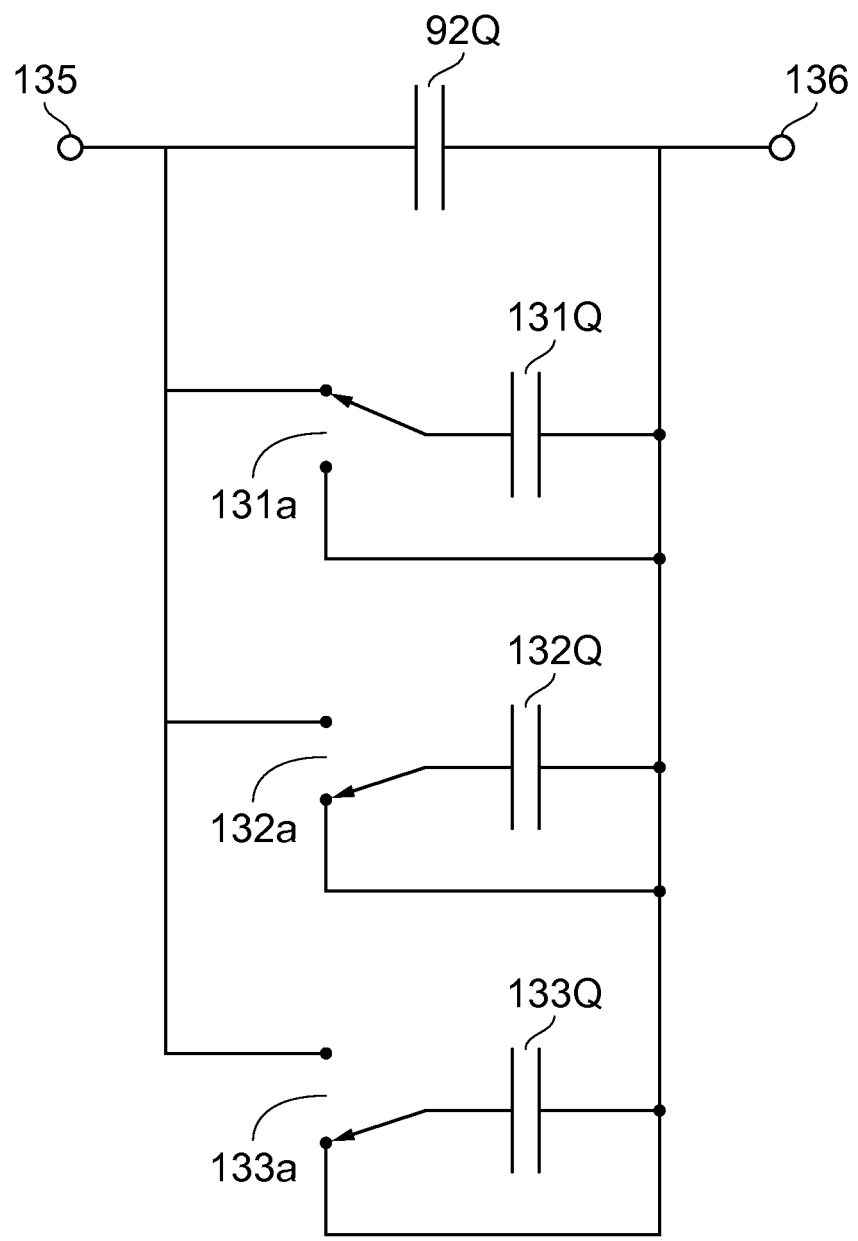
FIG. 16b is a circuit diagram of a second embodiment of a trimmable capacitance within the compensation path.

FIG. 16b shows an alternative arrangement where the compensation capacitor 92Q for the Qth cell is provided with a trim network comprising capacitors 131Q, 132Q and 133Q selectively connectable in parallel with the compensation capacitor 92Q by way of switches 131a, 132a and 133a. However now the switches are two position switches such that a first terminal of the individual capacitors 131, 132 and 133 are selectively connectable to node 135 or 136, whereas the second terminal of the capacitors are always connected to either node 135 or 136. The nodes 135 and 136 represent connections to the opposing plates of the compensation capacitor 92Q. This arrangement prevents any capacitor plates from being left floating.

Figure 17:
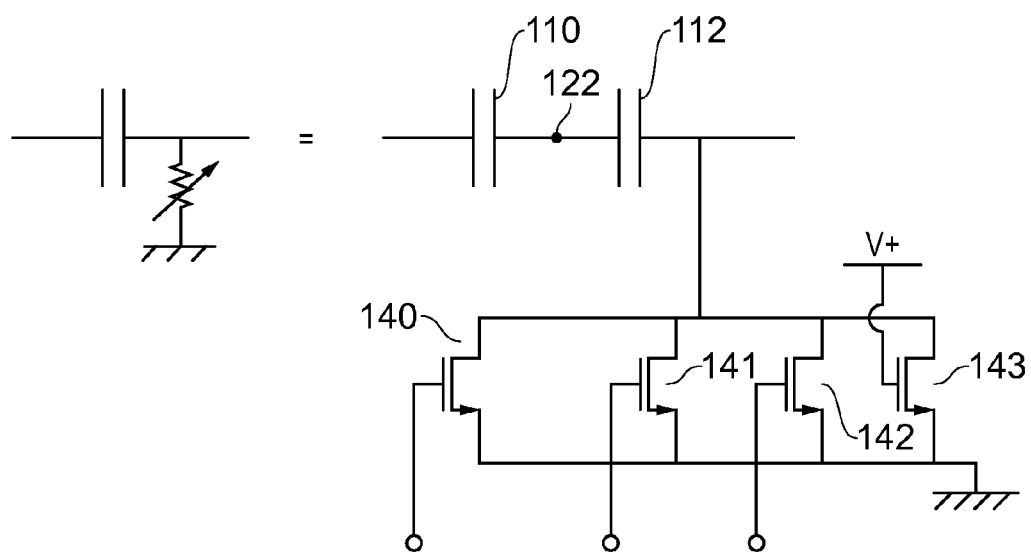
FIG. 17 is a circuit diagram representing an equivalent circuit arranged to provide a trimmable impedance, and hence trimmable high pass filter characteristic, that is adjustable as a function of the bit trial being performed by the analog to digital converter.

If it is further desired to dynamically trim the resistive component of the low pass filter response then the resistance to ground (in an AC sense) may need to be varied. This can be provided by providing multiple transistors in parallel as shown in FIG. 17. In FIG. 17 a plurality of transistors 140, 141, 142 and 143 are provided in parallel between the output of the compensation capacitor, here represented by series connected capacitances 110 and 112, but it could equally be a single capacitor 92Q. Each of the transistors may be individually controllable in response to a control signal from a controller to switch it on or off thereby varying the impedance to ground or to some other voltage such as Vref2. It should be noted that when this arrangement is used to trim the impedance to account for response changes associated with the resistances of the reference switches 50 and 52 (see FIG. 5), all transistors will be turned off both during the acquisition phase and during the conversion when a capacitor is connected to another reference. Thus they are only turned on if that particular cell is switched into the circuit. Switching the transistors on, places the "on state" impedance RDSon of that transistor in parallel with the on state impedance of each of the other transistors that happen to be switched on at that time. All of the transistors may be controllable or one of them, such as transistor 143, may be biased permanently on so as to set a maximum permanent resistance for the energized circuit, as would be appropriate if used in a circuit shown in FIG. 13. The transistors in FIG. 17 have been shown as being N-type devices but they could also be P-type devices or a mixture of N-type and P-type devices. In the arrangement of FIG. 17 the series connected capacitors 110 and 112 could be replaced by a single capacitor and/or may be used in conjunction with the variable capacitance of FIG. 16. A similar resistance trimming network could also be used in the DAC 30 to equalize, for example, the reference PMOS and NMOS on resistance.

Figure 18:
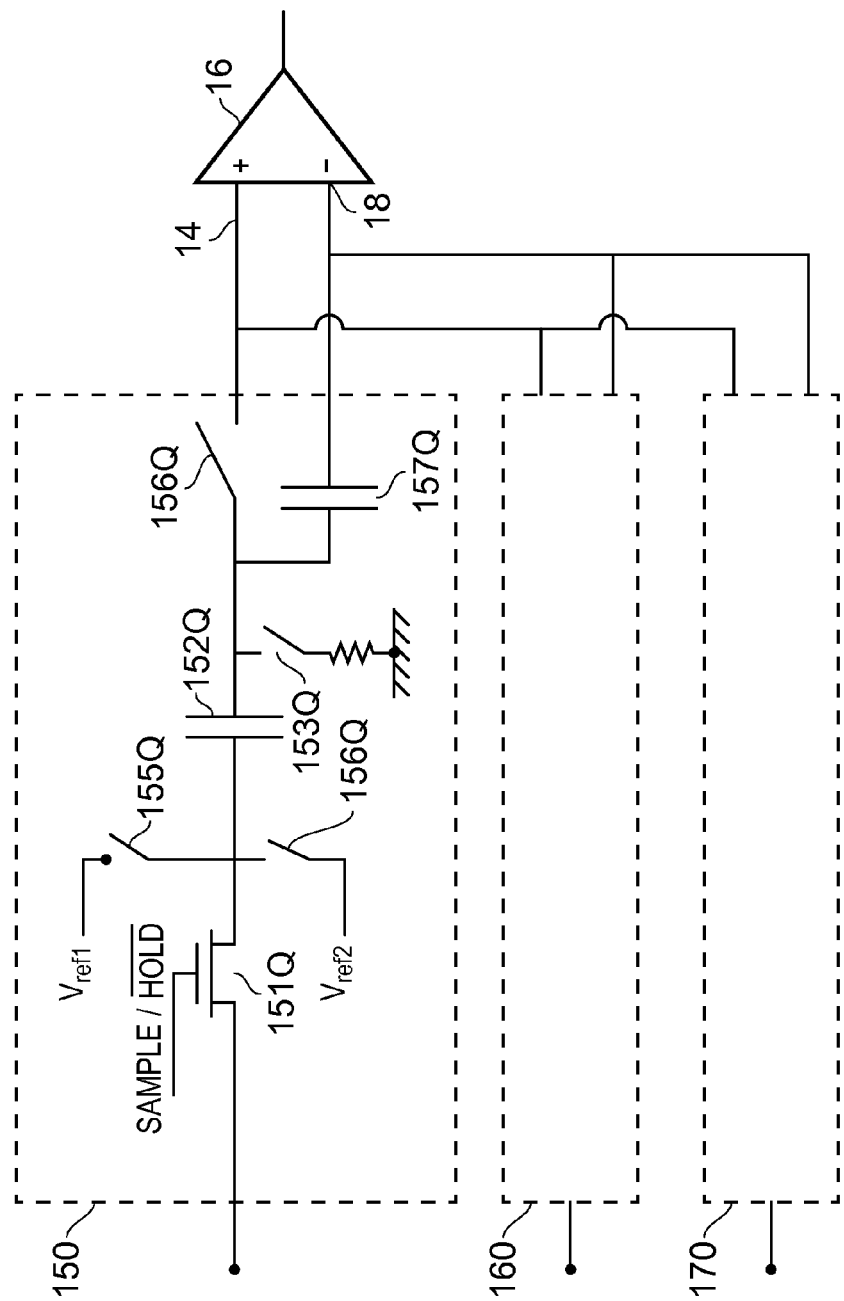
FIG. 18 illustrates an embodiment of a multiplexed sampling circuit and/or multiplexed analog to digital converter constituting a further embodiment of this disclosure.

FIG. 18 schematically shows a combined sampling circuit and multiplexer which, for simplicity, is shown as having three channels 150, 160 and 170 although fewer or more channels may be provided. For simplicity only the first channel will be described in detail. The first channel has an input switch 151 or switches 151Q connected to a respective sampling capacitor 152Q. The first channel also has a sampling switch 153Q arranged to connect a second plate of the capacitor to ground (or Vbias) to enable it to be charged. The sampling switches are designated 153. Each of the capacitors 152Q can be connected to Vref1 or Vref2 via respective switches 155Q and 156Q. For diagrammatic simplicity only the connections for capacitor 152Q are shown. Thus each of the channels 150, 160 and 170 forms a sampling and conversion array of an analog to digital converter having a shared comparator 16. Each channel could be selected or deselected by a multiplexer comprising switches 156Q to provide a connection from the array to the non-inverting input 14 of the comparator 16. Compensation capacitors 157Q are provided to the inverting input of the comparator 16 such that, as described before, transient signals leaking through the input switches 151Q are provided as common mode inputs from the inactive channels to the comparator 16. Each active channel may, of course, include the capacitors as described hereinbefore to compensate for leakage through its own input switch. It is thus possible to provide an input sampling arrangement which is generally insensitive to voltage transitions at its input node during non-acquire phases of operation of the circuit.

Figure 19:
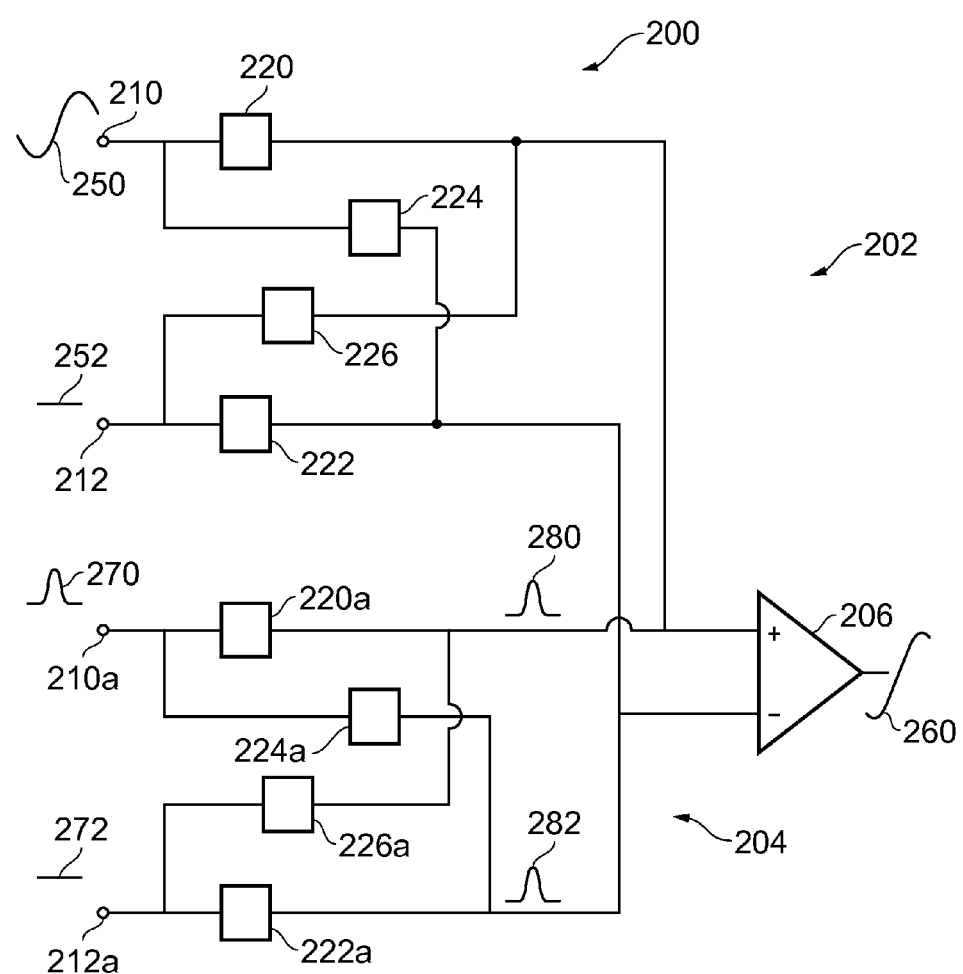
FIG. 19 shows a multiplexer and amplifier having circuits for rejecting interference from non-selected channels.

FIG. 19 shows a multiplexer, generally designated 200, comprising a first differential channel 202 and a second differential channel 204 providing signals to a differential amplifier 206. The first channel has first and second inputs 210 and 212. The first input 210 is connected to a non-inverting input of the amplifier 206 by way of a first electrically controlled switch 220. Similarly the second input 212 is connected to the inverting input of the amplifier 206 by way of an electrically controlled switch 222. A compensation component 224, representing the impedance of the switch 220 when it is in its open (high impedance) configuration, couples the first input 210 to the inverting input of the amplifier 206. Similarly a second compensation component 226 representing the impedance of the switch 222 when it is open couples the second input 212 to the non-inverting input of the amplifier 206. The second channel is similarly constructed and like components are given like reference numbers with the suffix A. More channels can be added to the circuit without loss of functionality.

FIG. 19 also illustrates input signals occurring at the various nodes. Thus a sinusoid 250 is presented to the first input node 210 and a DC voltage 252 is supplied to the second input node 212. It will be assumed that switches 220 and 222 are in a low impedance state, and switches 220a and 222a are in a high impedance states such that a signal 260 at the output of the amplifier 206 should represent the difference between the signals 250 and 252 only, and should not be effected by signals occurring at nodes 210a and 212a. Suppose that a transient signal 270 occurs at node 210a whilst a DC signal 272 occurs at node 212a. The transient signal 270 can propagate through a parasitic capacitance of the switch 220a. This gives rise to a perturbation 280 being propagated towards the non-inverting input of the amplifier 206. However by virtue of the compensation component 224a a similar transient signal 282 is propagated towards the inverting input of the amplifier 206. As the signals 280 and 282 arrive as common mode signals they are rejected by the amplifier 206 such that its output 260 is not perturbed by the presence of the transient signal 270 occurring at the input of the second channel.

Figure 20:
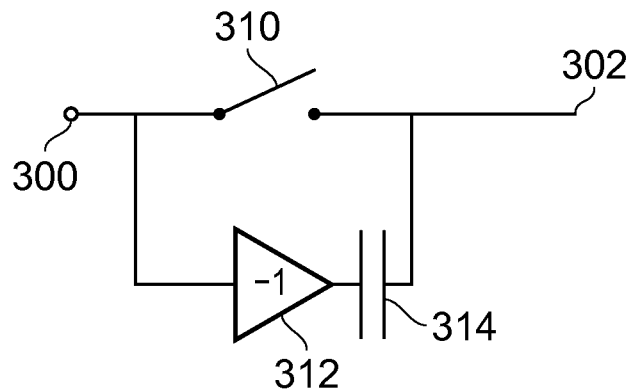
FIG. 20 illustrates a further embodiment of a signal gate having the ability to suppress transient signals during a second mode of operation.

Some circuits do not include differential components and therefore providing common mode signals at first and second outputs of the signal gate is not appropriate. Under such conditions a signal gate of the form shown in FIG. 20 may be used. Here the signal gate has an input node 300 connected to an output node 302 by way of an electrically controlled switch 310. The switch may be a field effect transistor. When the switch 310 is open, then as discussed before, a parasitic capacitance may still connect nodes 300 and 302. However in order to cancel the effect of this parasitic capacitance an inverting amplifier 312 or a transformer may be provided which receives the signal from the input node 300 and multiplies it by a negative gain, for example −1, and then the output of the amplifier (or transformer) is provided to the output node 302 by way of a DC blocking capacitor 314. The DC blocking capacitor may be sized to be substantially the same as that of the parasitic capacitance of the switch 310. Thus, when the switch 310 is open matched AC signal paths exist between nodes 300 and 302 in order to introduce complimentary cancelling signals at the node 302.

Figure 21:
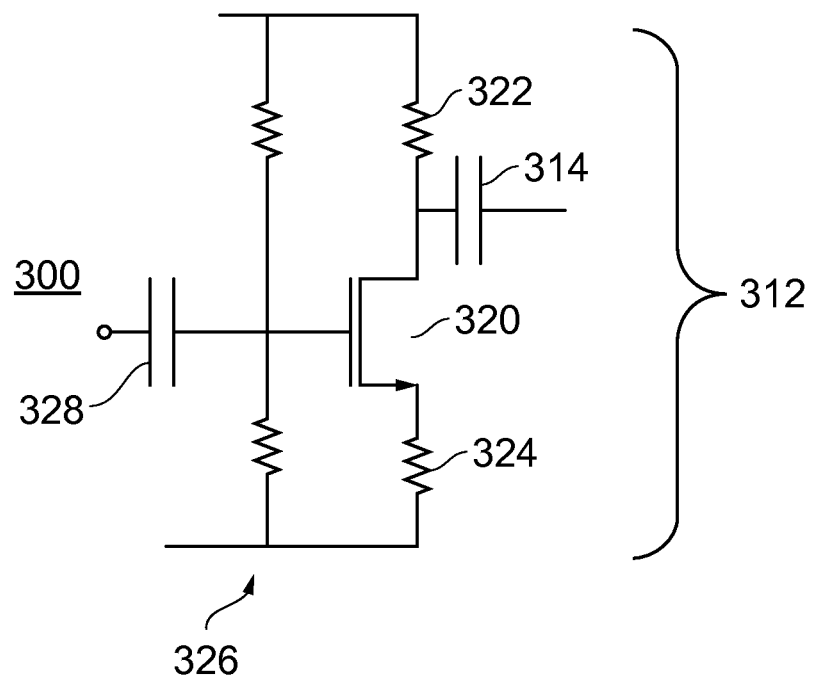
FIG. 21 is a circuit diagram of an embodiment of an inverting amplifier.

The amplifier 312 does not need to provide any significant amount of current. Furthermore as it is only compensating for small leakage signal then the amplifier can be designed to draw a low current. FIG. 21 illustrates a suitable configuration for the amplifier 312 where a field effect transistor 320 has a resistor 322 connected to its source and a resistor 324 connected to its drain, and where resistors 322 and 324 are of similar magnitude and may both be large such that the FET passes only a small amount of current. The FET 320 may be arranged in a self-biasing configuration or may be biased to a suitable operating voltage by a biasing network 326 comprising two resistors between the power supply rails as well known to the person skilled in the art. In order not to determine the bias voltage a DC blocking capacitor 328 may be provided between the gate of the FET 320 and the node 300.

It is thus possible to provide an improved signal gate, an improved sampling circuit and an improved analog to digital converter.

The claims presented here are in single dependency format suitable for filing at the USPTO. However it should be understood that each claim may depend on any preceding claim except when that is clearly not feasible.

The invention claimed is:

1. A circuit system, comprising:
a signal gate coupled between a first input node and first and second output nodes, wherein the signal gate is arranged to provide, during a first mode, a low impedance path between the first input node and the first output node, and during a second mode, signal paths to the first and second output nodes such that voltage changes at the first input node give rise to common mode signals at the first and second output nodes.

2. The circuit system of claim 1, further comprising a first switch between the first input node and the first output node, and where the first switch is placed in a relatively low impedance state during the first mode and in a relatively high impedance state during the second mode.

3. The circuit system of claim 2, further comprising a first impedance between the first input node and the second output node, the first impedance having an impedance that substantially matches that of the first switch in its relatively high impedance state.

4. The circuit system of claim 2, further comprising a filter associated with the second output node, wherein the filter has a transfer characteristic that substantially matches a transfer characteristic between the input node and the first output node when the signal gate is in the second mode.

5. The circuit system of claim 2, further comprising a second input node, a second switch operably connected between the second input node and the second output node, and a second impedance connected between the second input node and the first output node, wherein the second impedance has an impedance that substantially matches the impedance of the second switch in a high impedance state.

6. The circuit system of claim 2, further comprising a second input node, a second switch operably connected between the second input node and the second output node, and a second impedance connected between the second input node and the first output node, wherein the second impedance provides a transfer characteristic that substantially matches the transfer characteristic between the second input node and the second output node when the second switch is in a high impedance state.

7. The circuit system of claim 1, further comprising a sampling circuit that includes the signal gate and at least one capacitor having a first plate operably connected to the first output node and a second plate operably connected to a bias voltage.

8. The circuit system of claim 1, in which an impedance between the first input node and the second output node comprises a capacitive element.

9. The circuit system of claim 8, in which the capacitive element comprises a transistor switch in a high impedance state.

10. The circuit system of claim 8, in which the capacitive element is formed by depositing metal layers having an analogous or same size and configuration as the metal layers forming connections to the at least one input switch but without depositing all of the active regions of transistors in the circuit system.

11. The circuit system of claim 8, in which the capacitive element is part of a trimmable capacitor network.

12. The circuit system of claim 8, in which the capacitive element comprises at least two capacitors and switch operatively connected so as to form a trimmable AC impedance.

13. The circuit system of claim 8, further comprising a resistance operably connected between the second output node and a signal path to ground.

14. The circuit system of claim 13, in which the resistance is variable to adjust a time constant of the high pass filter formed with the capacitive element.

15. The circuit system of claim 14, further comprising an analog to digital converter that includes the signal gate, in which the resistance is variable as a function of a state of plurality of transistor switches associated with capacitors within a capacitor based digital to analog converter.

16. The circuit system of claim 1, further comprising an analog to digital converter that includes the signal gate for connecting an associated one of the at least a first sampling capacitor to the first input node during acquisition of an analog signal and for disconnecting the associated one of the at least a first sampling capacitor during a conversion period;
wherein the analog to digital converter further comprises a differencing circuit having first and second analog inputs and a voltage on the at least a first sampling capacitor is provided to a first analog input, and the second analog input is coupled to the second output node.

17. The circuit system of claim 16, in which the at least a first sampling capacitor is a capacitor within a capacitor array operable as a capacitive digital to analog converter.

18. The circuit system of claim 1, further comprising a multiplexer that includes a plurality of the signal gate.

19. An analog to digital converter comprising:
a differencing circuit including first and second analog inputs; and
signal paths between the first and second analog inputs and a first input node of the analog to digital converter such that during a conversion phase of operation, voltage changes at the input node are presented as common mode signals to the first and second analog inputs.

20. The analog to digital converter of claim 19, further comprising at least a second input node, and a signal path between the first and second inputs of the differencing circuit and the second input node such that voltage changes at the second input node during a conversion phase of operation are presented as common mode signals to the first and second inputs of the differencing circuit.

21. The analog to digital converter of claim 19, comprising further inputs selectively connectable to the first input of the differencing circuit by way of respective switches and to the second input of the differencing circuit by way of compensation components.

22. The analog to digital converter of claim 19, wherein the differencing circuit is a comparator.

23. The analog to digital converter of claim 19, wherein the differencing circuit is an amplifier.

24. A method of compensating for transient signals propagating through a switching component in a signal path where the switching component selectively allows a signal to propagate and blocks the signal, the method further comprising:
   generating a compensation signal to mimic leakage of signal through the switching component; and
   canceling at least a portion of the transient signal from the compensation signal.

25. The method of claim 24, wherein the canceling comprises creating a common mode signal from the compensation signal.

26. The method of claim 24, wherein the canceling comprises combining the compensation signal with the leakage signal.

* * * * *

UNITED STATES PATENT AND TRADEMARK OFFICE
CERTIFICATE OF CORRECTION

PATENT NO. : 9,525,409 B2  
APPLICATION NO. : 14/708003  
DATED : December 20, 2016  
INVENTOR(S) : Hurrell et al.

Page 1 of 1

It is certified that error appears in the above-identified patent and that said Letters Patent is hereby corrected as shown below:

In the Claims

In Column 14, Line 22, in Claim 11, delete "trimmable" and insert --trimable--, therefor In Column 14, Line 25, in Claim 12, delete "trimmable" and insert --trimable--, therefor Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*